Feb. 9, 1954 E. L. CROSBY, JR 2,668,881
MAXIMUM GAIN-BANDWIDTH AMPLIFIER SYSTEM
Filed Dec. 27, 1949 2 Sheets-Sheet 1
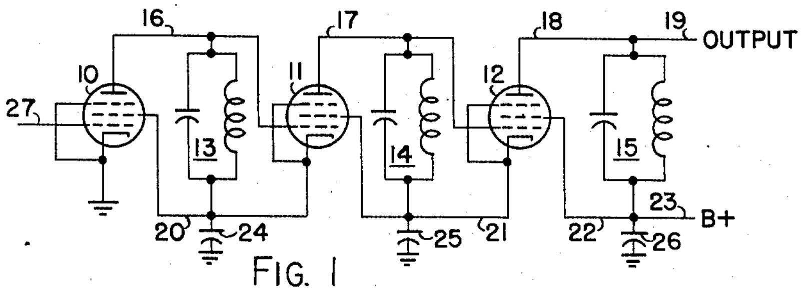
FIG. 1
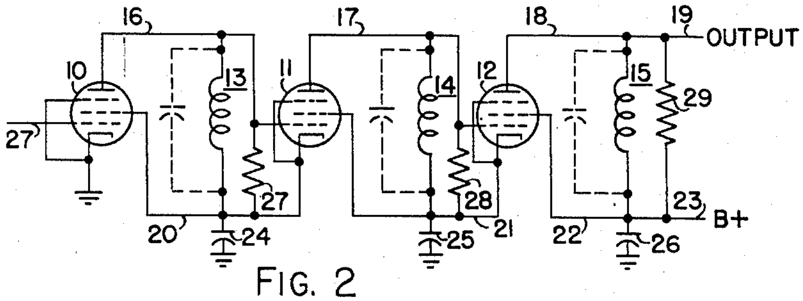
FIG. 2
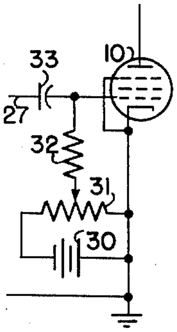
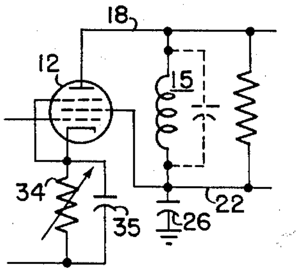
FIG. 4
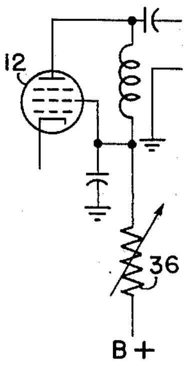
FIG. 3
FIG. 5
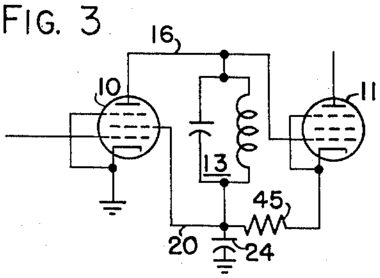
FIG. 6
EDWARD L. CROSBY, JR
INVENTOR.
BY *Killman and Kerst*

Feb. 9, 1954 E. L. CROSBY, JR 2,668,881

MAXIMUM GAIN-BANDWIDTH AMPLIFIER SYSTEM

Filed Dec. 27, 1949 2 Sheets-Sheet 2

EDWARD L. CROSBY, JR.
Inventor

By Killman and Kerst
Attorney

Patented Feb. 9, 1954 2,668,881

UNITED STATES PATENT OFFICE 2,668,881

MAXIMUM GAIN-BANDWIDTH AMPLIFIER SYSTEM

Edward L. Crosby, Jr., Baltimore, Md., assignor to Bendix Aviation Corporation, Towson, Md., a corporation of Delaware Application December 27, 1949, Serial No. 135,275

5 Claims. (Cl. 179—171)

This invention relates to amplifier systems, and is particularly concerned with economy of volume and component cost in multistage systems. Reduction of cost is a matter of constant importance in the competitive manufacture of electronic equipment and economy of volume is a factor of considerable importance in many installations.

Much effort has been spent in the miniaturization of equipment by the miniaturization of components but the present invention accomplishes miniaturization by the elimination of components. It may also be used in connection with miniaturization of components since it is adapted for use with printed circuits.

It is an object of this invention to provide an amplifier system having maximum gain-bandwidth product, but employing a minimum number of circuit components.

It is a further object of the invention to provide such an amplifier which occuplies a very small volume.

It is another object of the invention to provide such an amplifier which is inexpensive to manufacture.

It is a still further object of the invention to provide an amplifier system in which the gain of all stages may be controlled by control of the bias applied to a single stage or by control of the plate supply voltage.

It is still another object of the invention to provide an amplifier system which does not require the use of coupling or decoupling filters.

It is yet another object of the invention to provide an amplifier system which does not require the use of power supply trunks or busses.

These and other objects and advantages are realized by an amplifier system in which each stage is provided with a tuned coupling circuit, one terminal of the tuned circuit being directly connected to the control grid, and the other terminal being directly connected to the cathode, of the next succeeding stage. A condenser refers each tuned circuit and the cathode of its respective stage to a common ground plane by providing a very low impedance to the flow of currents of signal frequency. When multiple grid tubes are employed, the condenser may also serve to by-pass the screen grid for signal frequencies. The result is the establishment of a serial conductive path for plate supply current including the electron discharge paths and tuned circuits of all stages, while retaining a cascade connection for currents of signal frequency.

In the drawings:

Fig. 1 is a schematic circuit diagram of an amplifier embodying the invention as generally used at the lower radio frequencies;

Fig. 2 is a schematic circuit diagram of the amplifier of Fig. 1 modified for use at higher frequencies, with greater bandwidth;

Fig. 3 is a schematic diagram of the input stage of the circuit of Figs. 1 and 2 adapted for control of amplifier gain by control of the bias of that stage;

Fig. 4 is a schematic diagram of the output stage of the circuit of Figs. 1 and 2 with means for establishing a controlled bias for that stage;

Fig. 5 is a schematic diagram of the output stage of the circuit of Figs. 1 and 2 with means for varying the plate supply voltage of the amplifier and thus controlling its gain;

Fig. 6 is a schematic diagram of a fragment of the circuit of Fig. 1 showing a modification;

Figure 7:
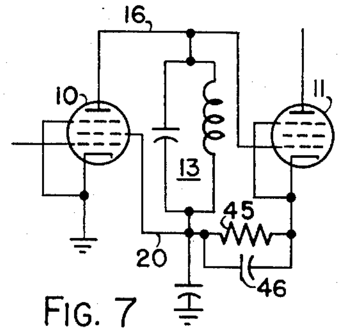
Fig. 7 is a schematic diagram of the circuit of Fig. 6 showing a further modification.

Referring more particularly to the drawing, Fig. 1 illustrates one embodiment of the invention as adapted for intermediate frequency use. It is shown as a three stage system employing pentode tubes 10, 11 and 12. Associated with each of these tubes is a parallel resonant coupling circuit indicated as 13, 14 and 15 respectively. A direct connection is provided by a conductor 16 between the anode of tube 10, the upper terminal of circuit 13 and the control electrode of tube 11. Likewise, a conductor 17 connects the anode of tube 11, the upper terminal of circuit 14 and the control grid of tube 12. A lead 18 connects the anode of tube 12 to the upper terminal of circuit 15 and to one of the output terminals of the amplifier.

The lower terminal of tuned circuit 13 is directly connected by a conductor 20 to the screen electrode of tube 10 and to the cathode of tube 11. A conductor 21 likewise connects the lower terminal of tuned circuit 14 to the screen electrode of tube 11 and to the cathode of tube 12. A conductor 22 connects the lower terminal of tuned circuit 15 to the screen electrode of tube 12 and to a source of plate supply voltage via terminal 23.

Connected between the lower terminals of tuned circuits 13, 14 and 15 and ground are condensers 24, 25 and 26 respectively. The capacities of these condensers are of such values as to present a very low impedance to the passage of currents of signal frequency. The cathode of tube 10 is grounded and signal is applied to the control grid of this tube by way of terminal 27. The condensers 24, 25 and 26 thus refer the lower terminals of the tuned circuits and the cathodes to a common ground plane for currents of signal frequency. The common ground plane may be either virtual or real.

It will be seen that there is a complete absence of coupling or decoupling filters. A path for direct current flow is established from terminal 23 serially through the electron discharge paths and tuned circuits of all the stages. At the same time a signal amplification loop is maintained within each stage by way of the respective condensers 24, 25 and 26. The signal amplification loop of the first stage of Fig. 1, for example, comprises the space discharge path of the tube 10, the tuned circuit 13 and the condenser 24. The condensers 24, 25 and 26 serve the function of maintaining separate the identities of the individual loops so that the system gain is the product of the gains of the individual loops.

The circuit as shown in Fig. 1 is adapted to use as an intermediate frequency channel in the lower radio frequencies. The tuned circuits may be tuned to different frequencies to provide a stagger-tuned system. The benefits of stagger tuning include control of the width of the frequency response of the system as well as control of the shape of the response to adapt the system to the handling of signals of various waveforms.

For operation at higher frequencies lumped capacitors may be dispensed with in the tuned circuits, the circuit in each case consisting of an inductance resonated with the output capacity of the driver stage and the input capacity of the driven stage. Such a circuit is shown in Fig. 2, the tuned circuits being indicated as made up of an actual inductor shunted by a virtual capacitor. At these frequencies it may be desirable to reduce the Q of the resonant circuits in the interest of broadening the frequency response of the system. This may be done as indicated in Fig. 2 by connecting a resistor across each circuit. Resistors 27, 28 and 29 are shown as connected for this purpose across the tuned circuits 13, 14 and 15 respectively.

Although this type of amplifier is obviously for high frequency use, the elimination of the lumped shunt capacitance is for the purpose of achieving a maximum gain-bandwidth product in accordance with the expression $$G \times \Delta f \cong \frac{GM}{2\pi c}$$

In narrower amplifiers, lumped capacitance can be used as a convenient means of permitting smaller inductances, since in a number of applications, the exact value of bandwidth is unimportant.

Among the advantages of the system is the ability to control the gain of the entire system by operating on it at a single point. This may be accomplished by control of the bias of any stage or by control of the plate supply voltage.

Figs. 3, 4 and 5 illustrate various gain control expedients which may be applied to the circuit of Figs. 1 and 2. In Fig. 3 is shown the tube 10 with means for controlling the bias thereof. This comprises the biasing battery 30 and the rheostat 31, the slider of which is connected to the control grid by way of resistor 32. A blocking condenser 33 is connected between the control grid and the input terminal 27.

While control of the gain by variation of the bias of the initial stage will not provide the optimum overload characteristic for strong signals, it may be difficult, at high frequencies, to enter the system at a later stage for bias control. Where this can be done, however, control of the bias of the final stage is preferable and is illustrated in Fig. 4 in which tube 12 is shown provided with a variable cathode resistor 34 by-passed by a condenser 35.

Gain may also be controlled by varying the plate supply voltage as by means of the variable resistor 36 in the supply lead of the final stage as shown in Fig. 5.

If desired, degenerative feedback may be obtained in one or more stages by introduction of a resistor between the cathode and the by-pass condenser to which it is connected. This is illustrated in Fig. 6 which shows a fragment of an amplifier circuit such as that of Fig. 1 with a resistor 45 employed to provide degenerative feedback for the tube 11.

Such a resistor, by-passed for signal frequencies, may be used to provide bias. This is illustrated in Fig. 7 where the resistor 45 is by-passed by condenser 46 for signal frequencies to provide a bias for the grid of tube 11. The use of the resistor 45 with or without a by-pass condenser is equally feasible with any of the amplifiers shown.

Figure 8:
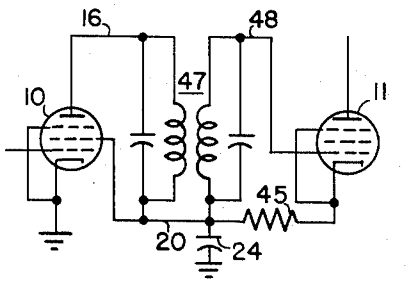
Fig. 8 is a schematic diagram of a portion of an amplifier similar to that of Fig. 1, but utilizing transformer coupling.

Fig. 8 illustrates the employment of the invention where transformer coupling is used between stages. A transformer 47 having tuned primary and secondary is used as coupling between tubes 10 and 11. The secondary is directly connected to the control grid of tube 11 by conductor 48 and degenerative feedback is provided by resistor 45.

Figure 9:
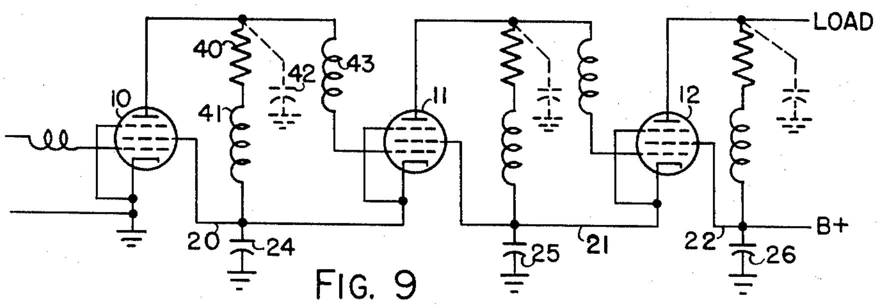
Fig. 9 is a schematic diagram of a video amplifier embodying the invention.

Fig. 9 illustrates the application of the invention to a video amplifier circuit. Interstage coupling is provided by an inductor such as the coil 43. The screen grid of each stage, except the last, is directly connected to the cathode of the next succeeding stage as in the above described amplifiers.

Conventional loading arrangements such as the serially connected resistor 40 and inductor 41 may be employed. They function as in conventional video circuits, the inductor 41 compensating for the losses introduced at the higher frequencies by the output capacity of the driver stage and the input capacity of the driven stage, as represented by the dashed condenser 42. Condensers 24, 25 and 26 function as they do in the preceding circuits to refer the load circuits and cathodes to a common ground plane.

This amplifier, in contrast to the usual resistance capacitance coupled amplifier will transmit the direct current reference level of a video signal since any change in voltage on the grid of the first tube will change the current in the last plate load. The low frequency response, however, will depend critically upon the values of condensers 24, 25 and 26. Due to the ability of the circuit to pass a reference level of direct current, direct current restorer arrangements may be dispensed with in many cases.

Circuits embodying the invention possess many advantages not enumerated above. Due to the absence of time constant circuits, they provide immediate recovery from overloading pulses, as from static, radar and ignition. The plate current consumption is low and excellent stability is realized due to the absence of decoupling chains and power supply trunks or busses.

While only one means of supplying the direct current feed bias has been disclosed, other arrangements are feasible, such, for example, as the use of a grounded output anode. The invention is also applicable to other types of circuits such as the grounded-grid and grounded-plate types and to other types of amplfiers such as audio frequency. The manner of applying the invention to such circuits will be apparent to those skilled in the art.

The use of the invention is not confined to cascaded stages operating at the same frequency. For example, it can be employed in the final intermediate frequency stage of a multi-stage channel, as well as in the first stage of a video chain which is fed therefrom through a diode utilizing peaking.

Figure 10:
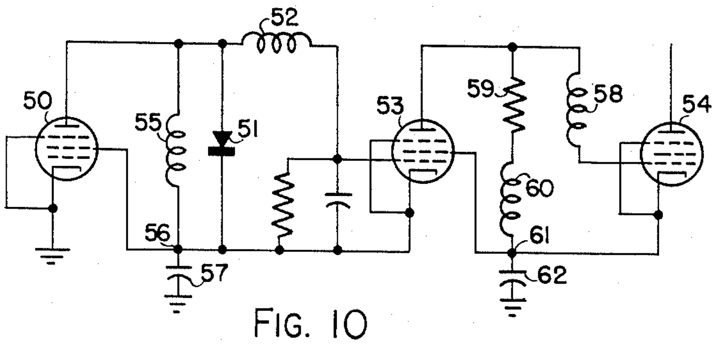
Fig. 10 is a schematic diagram of a circuit comprising portions of an I. F. channel and a video channel, showing the utilization of the invention in such a transitional arrangement.

Such a circuit is shown in Fig. 10 in which the last stage of an I. F. channel comprises the tube 50 followed by the shunt connected diode 51 feeding through a peaking coil 52 into the first stage 53 of a video amplifier chain of which tube 54 constitutes the second stage. The screen grid of the tube 50 is directly connected to the lower terminal 56 of loading impedance 55 as is the cathode of tube 53. Condenser 57 which presents a low impedance to currents of signal frequency connects the terminal 56 to ground. The video tubes 53 and 54 are likewise coupled in accordance with the invention, the anode of tube 53 being connected through inductor 58 to the control electrode of tube 54. A conductive path for direct current is provided through the loading impedance network comprising resistor 59 and inductor 60 to the cathode of tube 54 which the lower terminal 61 is grounded for currents of signal frequency through condenser 62.

Other examples of the use of the invention, in situations other than in cascaded amplifiers handling the same frequencies, include its employment in the transition from the sync. separator to the vertical oscillator and from the horizontal oscillator to the horizontal output circuit.

While the embodiments illustrated employ pentode tubes, the use of such tubes is not necessary to the invention. Triodes, for example, may be employed, if desired.

What is claimed is:

1. An amplifier comprising three or more cascaded stages, each of said stages comprising a pentode tube having a tuned circuit associated therewith, means applying signal voltage between the control grid and cathode of the first of said stages, said cathode being grounded. means providing a direct connection between the anode of each of said stages and one terminal of the tuned circuit associated therewith and a direct connection between the screen grid of said stage and the other terminal of said tuned circuit, means in each of said stages except the final stage providing a direct connection between said one terminal of said tuned circuit and the control electrode of the next succeeding stage and a direct connection between the said other terminal of said tuned circuit and the cathode of the next succeeding stage, a condenser connected between said other terminal of each of said tuned circuits and a common ground plane, said condenser having a capacity of such value as to present a low impedance to the passage of currents of signal frequency therethrough, and means applying a direct current potential between said other terminal of the one of said tuned circuits associated with said final stage and said ground plane.

2. An amplifier as set forth in claim 1, said amplifier characterized in that a resistor is connected across each of said tuned circuits to lower the Q thereof and thereby broaden the amplifier response.

3. An amplifier as set forth in claim 1, each of said tuned circuits being resonant at a different frequency, thereby controlling the width of the frequency response of said amplifier and the shape thereof.

4. An amplifier as set forth in claim 1, said amplifier having means establishing a bias on the control electrode of one of said stages, thereby controlling the gain of all of said stages.

5. An amplifier comprising three or more cascaded stages, each of said stages comprising a pentode tube having a tuned circuit associated therewith, means applying signal voltage between the control grid and cathode of the first stage, said cathode being grounded, each of said tuned circuits comprising a double tuned transformer, the primary and secondary of which are connected to a common terminal, means providing a direct connection between the anode of each of said stages and the remaining terminal of the primary of the one of said transformers associated therewith and a direct connection between the screen grid of said stage and said common terminal of said transformer, means in each of said stages except the final stage providing a direct connection between the remaining terminal of the secondary of the transformer associated therewith and the control grid of the next succeeding stage and a direct connection between the common terminal of said transformer and the cathode of the next succeeding stage, a condenser connected between said common terminal of each of said transformers and a common ground plane, said condenser having a capacity of such value as to present a low impedance to the passage of signal frequency therethrough, and means applying a direct current potential between said common terminal of the one of said transformers associated with said final stage and said ground plane.

EDWARD L. CROSBY, Jr.

References Cited in the file of this patent

UNITED STATES PATENTS

| Number | Name | Date |
|---|---|---|
| 2,082,517 | Rust | June 1, 1937 |
| 2,278,801 | Rust | Apr. 7, 1942 |
| 2,289,091 | Bell | July 7, 1942 |
| 2,310,910 | Rust | Feb. 4, 1943 |
| 2,342,492 | Rankin | Feb. 22, 1944 |
| 2,451,893 | Wallman | Oct. 19, 1948 |
| 2,455,510 | Ludwig | Dec. 7, 1948 |
| 2,543,819 | Williams | Mar. 8, 1951 |

FOREIGN PATENTS

| Number | Country | Date |
|---|---|---|
| 536,583 | Great Britain | May 20, 1941 |